(12) United States Patent
Muramoto

(10) Patent No.: US 10,804,424 B2
(45) Date of Patent: Oct. 13, 2020

(54) METHOD FOR MANUFACTURING LIGHT EMITTING ELEMENT

(71) Applicant: NICHIA CORPORATION, Anan-shi, Tokushima (JP)

(72) Inventor: Eiji Muramoto, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/691,559

(22) Filed: Aug. 30, 2017

(65) Prior Publication Data

US 2018/0062025 A1    Mar. 1, 2018

(30) Foreign Application Priority Data

Aug. 31, 2016  (JP) .................. 2016-168673

(51) Int. Cl.
*H01L 23/00* (2006.01)
*H01L 33/00* (2010.01)
*H01L 33/38* (2010.01)
*H01L 33/24* (2010.01)
*H01L 33/62* (2010.01)

(52) U.S. Cl.
CPC .......... *H01L 33/0093* (2020.05); *H01L 24/94* (2013.01); *H01L 33/0095* (2013.01); *H01L 33/24* (2013.01); *H01L 33/38* (2013.01); *H01L 33/62* (2013.01); *H01L 33/007* (2013.01); *H01L 2933/0016* (2013.01); *H01L 2933/0066* (2013.01)

(58) Field of Classification Search
CPC ............................ H01L 24/94; H01L 33/0079

USPC ........................................................... 438/33
See application file for complete search history.

(56) References Cited

U.S. PATENT DOCUMENTS

| 2011/0215364 A1* | 9/2011 | Sugawara | ............... H01L 33/40 257/99 |
| 2013/0153920 A1* | 6/2013 | Sugawara | ........... H01L 33/0079 257/76 |
| 2013/0164866 A1 | 6/2013 | Sugawara et al. | |
| 2014/0110737 A1 | 4/2014 | Matsumura | |
| 2015/0034900 A1* | 2/2015 | Aihara | .................... H01L 33/20 257/13 |

(Continued)

FOREIGN PATENT DOCUMENTS

| JP | 2010-027643 A | 2/2010 |
| JP | 2011-187556 A | 9/2011 |

(Continued)

*Primary Examiner* — Hsin Yi Hsieh

(74) *Attorney, Agent, or Firm* — Foley & Lardner LLP

(57) ABSTRACT

A method for manufacturing a light emitting element includes: forming a semiconductor structure on a first substrate; providing a second substrate configured to be bonded above a side of the semiconductor structure opposite the first substrate; forming a metal layer above at least one of (i) a side of the semiconductor structure opposite the first substrate, and/or (ii) a side of the second substrate that is to be located closer to the semiconductor structure; bonding the second substrate above the semiconductor structure via a bonding member; removing the first substrate from the semiconductor structure to obtain a bonded body in which the second substrate is bonded above the semiconductor structure; and singulating the bonded body.

30 Claims, 12 Drawing Sheets

(56) References Cited

U.S. PATENT DOCUMENTS

| | | | |
|---|---|---|---|
| 2016/0133793 | A1 | 5/2016 | Sugawara et al. |
| 2017/0084788 | A1* | 3/2017 | Sugiyama ........... H01L 33/0079 |
| 2017/0170052 | A1* | 6/2017 | Takebayashi ..... H01L 21/67103 |

FOREIGN PATENT DOCUMENTS

| | | |
|---|---|---|
| JP | 2014/086573 A | 5/2014 |
| JP | 2014-175512 A | 9/2014 |
| JP | 2014/236070 A | 12/2014 |
| JP | 2015-177132 A | 10/2015 |
| JP | 2016/100487 A | 5/2016 |

\* cited by examiner

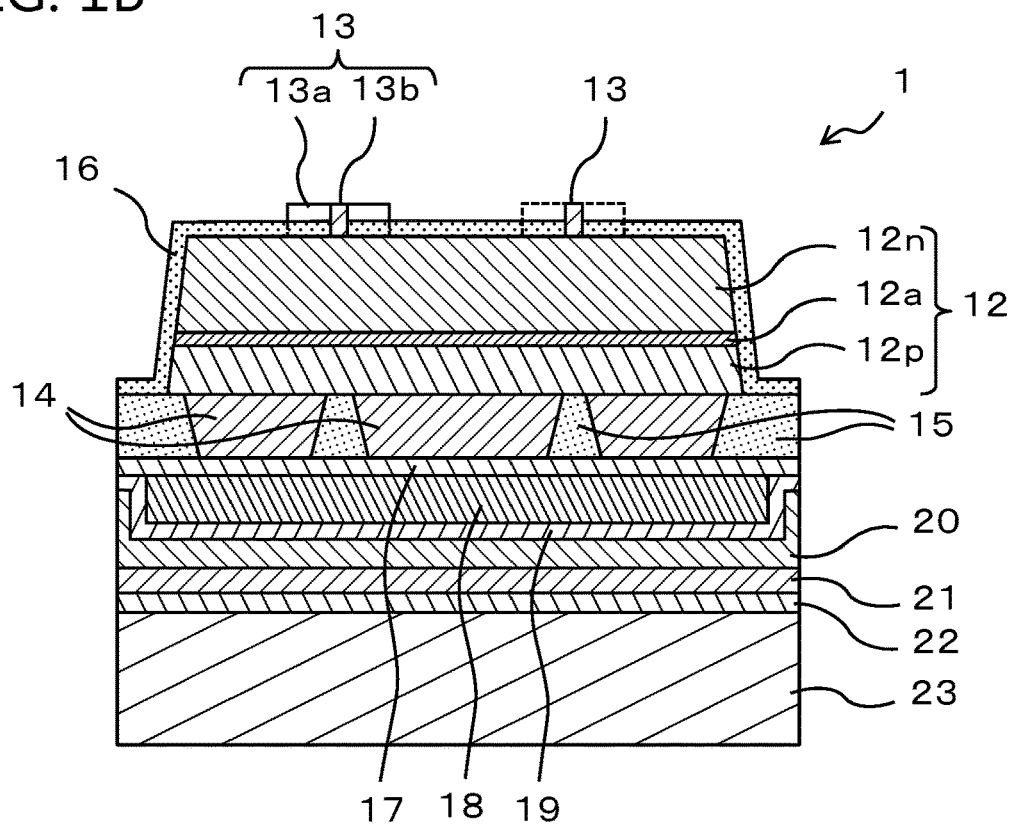
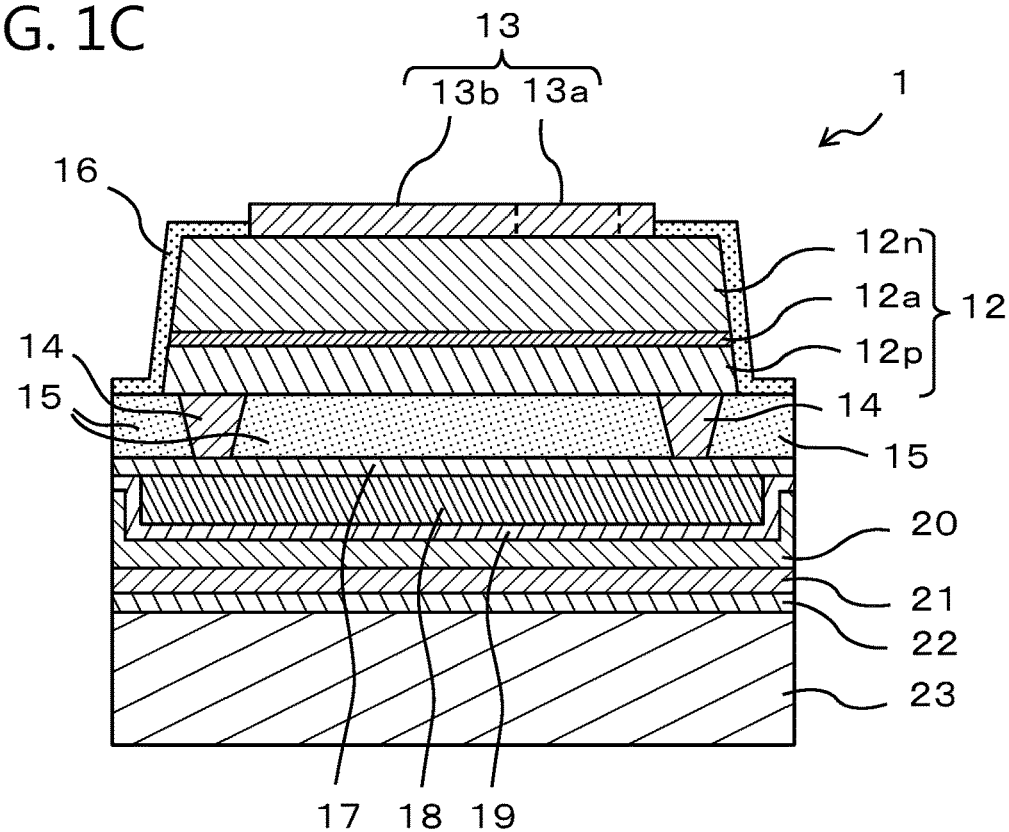

METHOD FOR MANUFACTURING LIGHT EMITTING ELEMENT

CROSS-REFERENCE TO RELATED APPLICATIONS

The present application claims priority under 35 U.S.C. § 119 to Japanese Patent Application No. 2016-168673, filed on Aug. 31, 2016, the contents of which are hereby incorporated by reference in their entirety.

BACKGROUND

1. Field of the Invention

The present disclosure relates to a method for manufacturing a light emitting element.

2. Description of Related Art

There is known a method for manufacturing a light emitting element, the method including, in order: forming a semiconductor layer on a growth substrate such as a sapphire substrate; bonding a support substrate on a surface of the semiconductor layer opposite the growth substrate; and removing the growth substrate (see, for example, Japanese Patent Publication No. 2014-236070, hereinafter referred to as patent document 1). The bonding of the support substrate to the semiconductor layer is performed by arranging therebetween a bonding member composed of a metal and heating them.

Like the light emitting element manufacturing method disclosed in patent document 1, when the support substrate is bonded with the semiconductor layer by heating them using a bonding member such as a solder, the resulted light emitting element may warp due to the difference between the thermal expansion coefficients of the semiconductor layer and the bonding member. This may make it even harder to handle the light emitting element in the subsequent manufacturing process and thus result in a low-yield.

For the purpose of reducing the warp of the light emitting element, a metal layer having a thermal expansion coefficient smaller than that of the bonding member may be disposed between the semiconductor layer and the supporting substrate. However, arranging the metal layer makes it difficult to perform singulation using blade dicing or laser dicing.

It is an object of certain embodiments described in this application to provide a light emitting element manufacturing method that allows for manufacturing of light emitting elements with ease of singulation and high yield.

SUMMARY

According to one embodiment, a method for manufacturing a light emitting element includes steps of: forming a semiconductor structure on a first substrate; preparing a second substrate, which is to be bonded above a side of the semiconductor structure opposite the first substrate later; forming a metal layer above at least one of the side of the semiconductor structure opposite the first substrate and a side of the second substrate which side is to be located closer to the semiconductor structure; bonding the second substrate above the semiconductor structure via a bonding member therebetween; removing the first substrate from the semiconductor structure to obtain a bonded body in which the second substrate is bonded above the semiconductor structure; and singulating the bonded body into a plurality of light emitting elements by dividing the bonded body along singulation lines defining a plurality of light emitting element areas. In the step of forming a metal layer, a metal having a smaller thermal expansion coefficient than that of the bonding member is used for the metal layer, and the metal layer is formed such that the metal layer does not overlap with at least a part of the singulation lines and is present in each of the plurality of light emitting element areas in a plan view.

The method for manufacturing a light emitting element according to this embodiment may allow for manufacturing of light emitting elements with ease of singulation and high yield.

BRIEF DESCRIPTION OF THE DRAWINGS

A more complete appreciation of embodiments of the invention and many of the attendant advantages thereof will be readily obtained by reference to the detailed description below when considered in connection with the accompanying drawings.

FIG. 1B is a cross-sectional view taken along line IB-IB in FIG. 1A showing the configuration of the light emitting element that is obtained by the method for manufacturing a light emitting element according to the first embodiment.

FIG. 1C is a cross-sectional view taken along line IC-IC in FIG. 1A showing the configuration of the light emitting element that is obtained by the method for manufacturing a light emitting element according to the first embodiment.

DETAILED DESCRIPTION

Hereinafter, a description is given of a method for manufacturing a light emitting element according to a first embodiment.

The drawings referenced in the following description schematically show the embodiments. Thus, scales of members, distances between members, positional relations between members, or the like may be presented in an exaggerated manner, and illustration of a part of a member may be omitted. Furthermore, the scales and distances between members may not match between a plan view and its corresponding cross-sectional view. In the description below, members that are the same or analogous are given the same name or number in principle, and duplicative detailed descriptions are appropriately omitted.

Terms such as "upper" and "lower" herein indicate relative positions of constituent elements, and are not intended to represent absolute positions.

First Embodiment

[Configuration of Light Emitting Element]

Figure 1A:
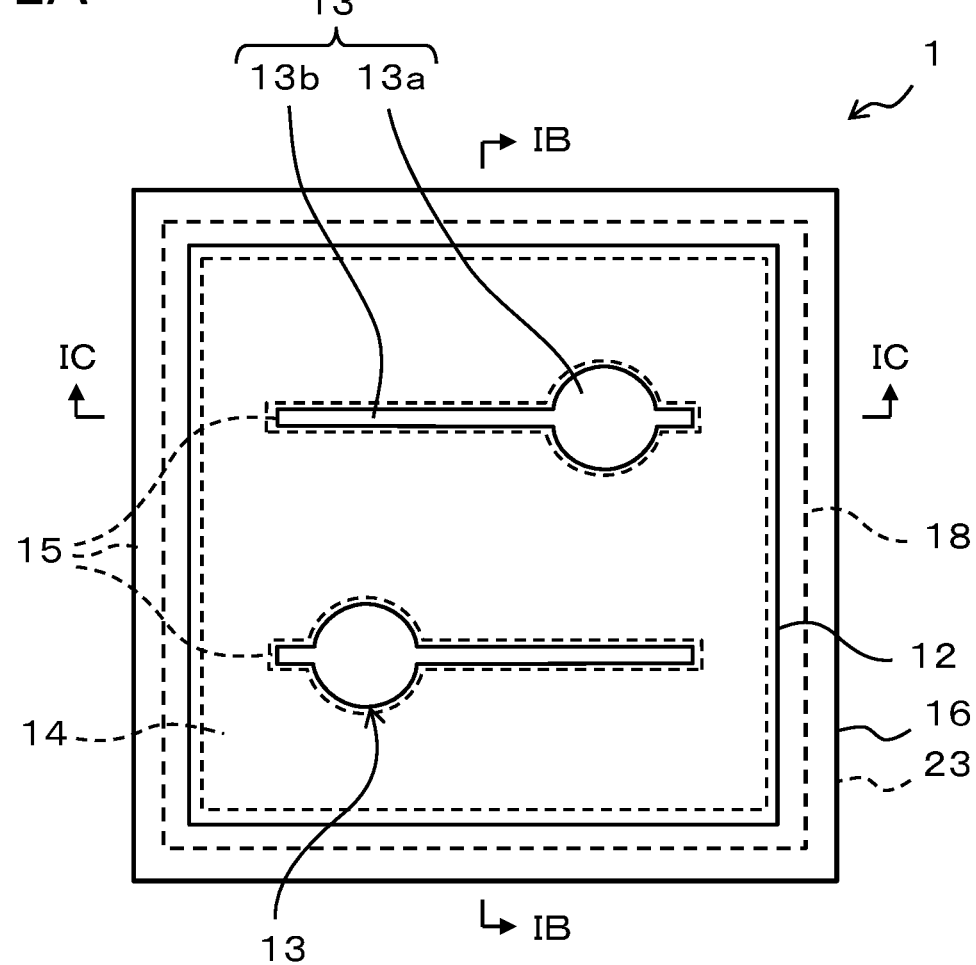
FIG. 1A is a plan view showing the configuration of a light emitting element that is obtained by a method for manufacturing a light emitting element according to a first embodiment.

First, to facilitate understanding the method for manufacturing a light emitting element according to a first embodiment, a description is given of the configuration of a light emitting element 1 manufactured by the method for manufacturing a light emitting element according to the first embodiment with reference to FIGS. 1A to 1C. Subsequently, with reference to FIGS. 2 to 3J, a description is given of the method for manufacturing a light emitting element according to the first embodiment.

A second embodiment and a third embodiment are also described in a similar manner as in the first embodiment; i.e., a light emitting element is first described, and a method for manufacturing the light emitting element is then described.

The light emitting element 1 is formed so as to have an approximately square shape in a plan view. The light emitting element 1 includes: a semiconductor structure 12 provided with upper electrodes 13 and a lower electrode 14, a second substrate 23, and a second metal layer 18 located in between the semiconductor structure 12 and the second substrate 23. The semiconductor structure 12 is bonded above the second substrate 23 via bonding members 20 and 21. In a plan view, the area where the second metal layer 18 is formed includes the area where the semiconductor structure 12 is formed. In other words, the semiconductor structure 12 is disposed inside an outer edge of the second metal layer 18 in a plan view so as to completely overlap with the second metal layer 18. In addition, the second metal layer 18 does not extend up to the outer edge of the light emitting element 1. The second substrate 23 serves as a support substrate that supports the semiconductor structure 12. A first substrate 11 (see FIG. 3A), which is used in growing the semiconductor structure 12 by epitaxial growth, has been removed from the semiconductor structure 12.

The semiconductor structure 12 is a laminate including, in order from lower layer, a p-side semiconductor layer 12p, an active layer 12a, and an n-side semiconductor layer 12n, and functions as a light emitting diode (LED). The semiconductor structure 12 is provided with the upper electrodes 13 disposed so as to be in contact with the n-side semiconductor layer 12n located on the upper side, and is provided with the lower electrode 14 disposed so as to be in contact with the p-side semiconductor layer 12p located on the lower side. The semiconductor structure 12 has an approximately square shape and is disposed inside the outer edge of the light emitting element 1 in a plan view. The semiconductor structure 12 has inclined sides such as to have a trapezoidal shape when viewed in vertical cross-section. An upper surface and the inclined sides of the semiconductor structure 12 are covered by a protection film 16 except the areas where the upper electrodes 13 are disposed.

It is to be noted that the upper surface of the semiconductor structure 12 may have unevenness to increase light extraction efficiency.

In the semiconductor structure 12, a nitride semiconductor such as $In_XAl_YGa_{1-X-Y}N$ ($0 \leq X$, $0 \leq Y$, $X+Y<1$) is used for the n-side semiconductor layer 12n, the active layer 12a, and the p-side semiconductor layer 12p.

The upper electrodes 13 are disposed on an upper surface of the n-side semiconductor layer 12n, which is arranged as the upper layer of the semiconductor structure 12. The upper electrodes 13 are each an n-side electrode electrically connected to the n-side semiconductor layer 12n. Two upper electrodes 13 are disposed on the upper surface of the n-side semiconductor layer 12n. Each of the two upper electrodes 13 is composed of: an external connection portion 13a having an approximately circular shape in a plan view; and an auxiliary portion 13b that extends laterally from the external connection portion 13a. The external connection portion 13a is a pad electrode to be connected to the outside and is disposed at a location offset to the left or right from the center of the semiconductor structure 12 along a line parallel to a side of the semiconductor structure 12. The auxiliary portion 13b is an auxiliary electrode for efficiently distributing a current supplied to the external connection portion 13a in in-plane directions of the semiconductor structure 12. In the present embodiment, the two upper electrodes 13 have the same shape and are disposed so as to be point-symmetric with respect to each other about the center of the light emitting element 1 in a plan view.

The lower electrode 14 is a p-side electrode electrically connected to a lower surface of the p-side semiconductor layer 12p, which is arranged as the lower layer of the semiconductor structure 12. The lower electrode 14 is disposed so that, in a plan view, the contour of the lower electrode 14 is approximately the same as the contour of the area where the p-side semiconductor layer 12p is disposed, and the area of the lower electrode 14 does not overlap with the areas where the upper electrodes 13 are disposed. In addition, the lower electrode 14 is not disposed at the periphery of the light emitting element 1.

In the same layer as the lower electrode 14, insulating films 15 having substantially the same thickness as the lower electrode 14 are disposed in the areas where the lower electrode 14 is not disposed. In other words, the lower electrode 14 and the insulating films 15 are disposed in a complementary manner in the same layer.

The upper electrodes 13 and the lower electrode 14 may be disposed so that the areas of the upper electrodes 13 partially or entirely overlap with the area of lower electrode 14 in a plan view. It is preferable that the areas of the upper electrodes 13 and the lower electrode 14 do not overlap with each other. This structure is able to efficiently distribute a current flowing between the upper electrodes 13 and the lower electrode 14 in in-plane directions of the semiconductor structure 12, resulting in an increase in the emission efficiency of the light emitting element 1.

The second metal layer 18 is disposed between the semiconductor structure 12 and the second substrate 23 such that the area where the second metal layer 18 is disposed includes the area where the semiconductor structure 12 is disposed in a plan view. The second metal layer 18 is not disposed at the periphery of the light emitting element 1 in a plan view.

A first metal layer 17 is disposed between the second metal layer 18 and an layer composed of the lower electrode 14 and the insulating films 15, to increase the adhesion between the second metal layer 18 and the layer composed of the lower electrode 14 and the insulating films 15. A third metal layer 19 is disposed between the second metal layer 18 and a later-described bonding member 20 to increase the adhesion therebetween. The third metal layer 19 is disposed so as to cover an area larger than the area of the second metal layer 18. The third metal layer 19 has ends in contact with the first metal layer 17. That is, the second metal layer 18 is entirely covered by the first metal layer 17 and the third metal layer 19. This means that the first metal layer 17 and the third metal layer 19 are also able to function as barrier layers for the material of the second metal layer 18.

The bonding member 20 is a layer of bonding material disposed on the lower surface of the third metal layer 19. When the second substrate 23 and semiconductor structure 12 are bonded together with the second substrate 23 being arranged on the p-side semiconductor layer 12p side of the semiconductor structure 12, the bonding member 20 serves as a bonding layer arranged on the semiconductor structure 12 side. The bonding member 21 is a layer of bonding material disposed on the upper surface of a fourth metal layer 22, which is disposed on the second substrate 23. When the second substrate 23 and semiconductor structure 12 are bonded together with the second substrate 23 being arranged on the p-side semiconductor layer 12p side of the semiconductor structure 12, the bonding member 21 serves as a bonding layer arranged on the second substrate 23 side.

The plan view shape of the light emitting element 1 is not limited to square, but may be a polygonal shape, such as rectangular or hexagonal, or a circular shape. In addition, the plan view shape, location, and the number of the upper electrodes 13 are not limited to the embodiment described above.

[Method for Manufacturing Light Emitting Element]

Figure 2:
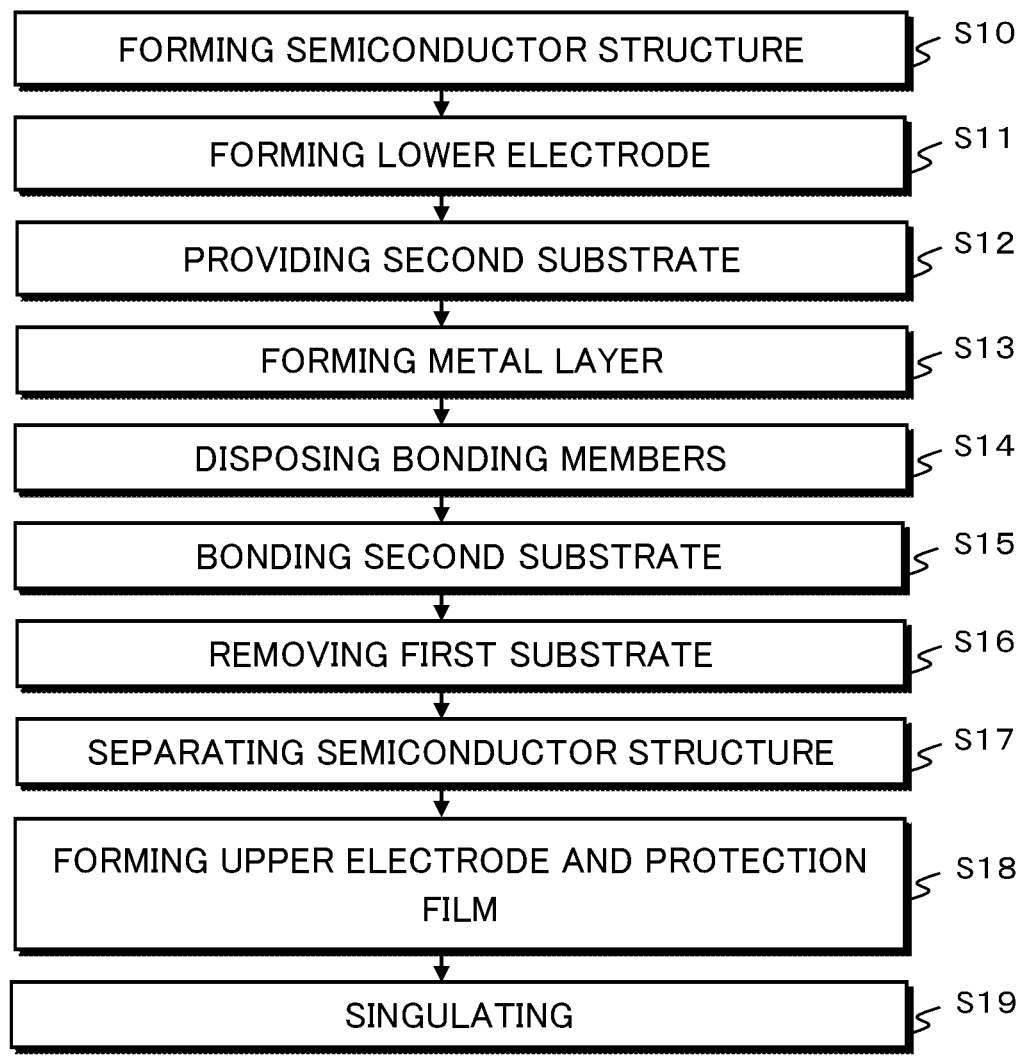
FIG. 2 is a flowchart illustrating the procedure of the method for manufacturing a light emitting element according to the first embodiment.
Figure 3A:
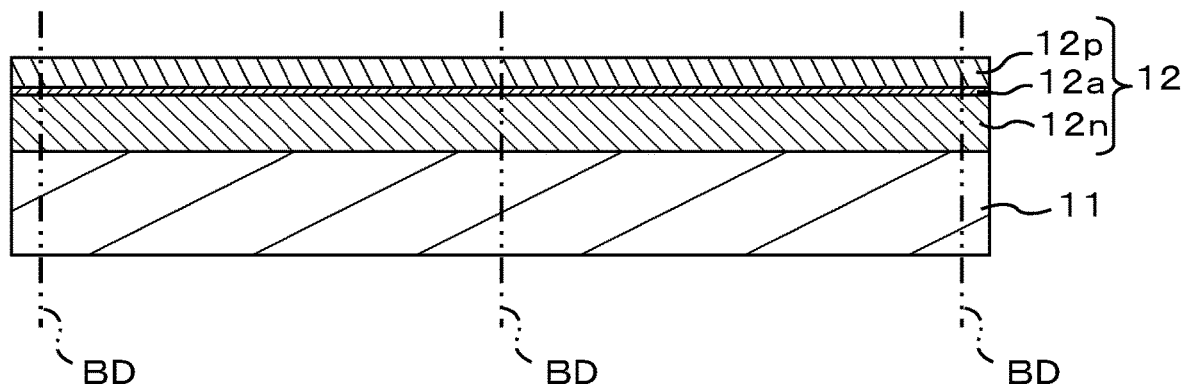
FIG. 3A is a cross-sectional view illustrating forming a semiconductor structure in the method for manufacturing a light emitting element according to the first embodiment.
Figure 3B:
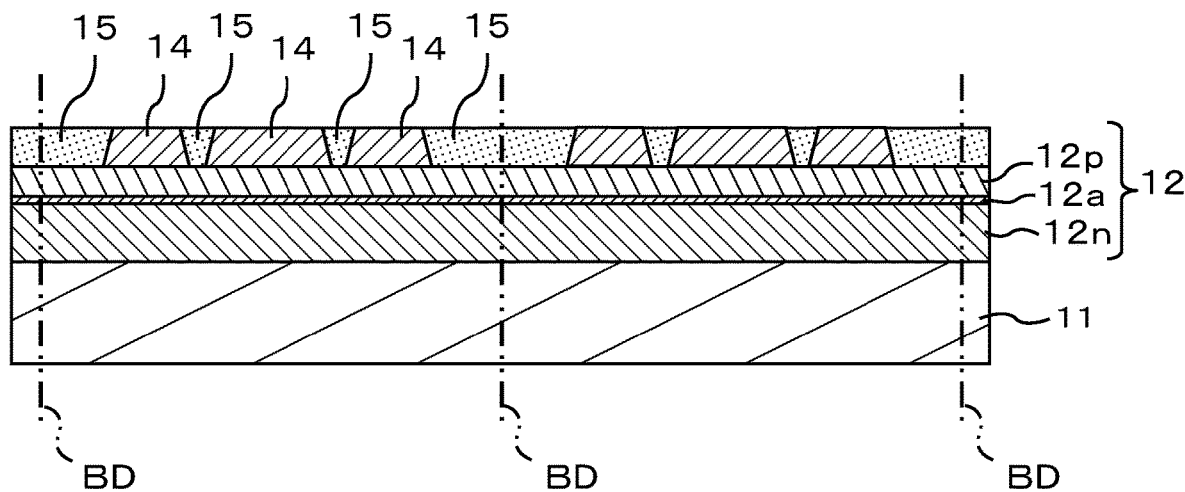
FIG. 3B is a cross-sectional view illustrating forming a lower electrode in the method for manufacturing a light emitting element according to the first embodiment.
Figure 3C:
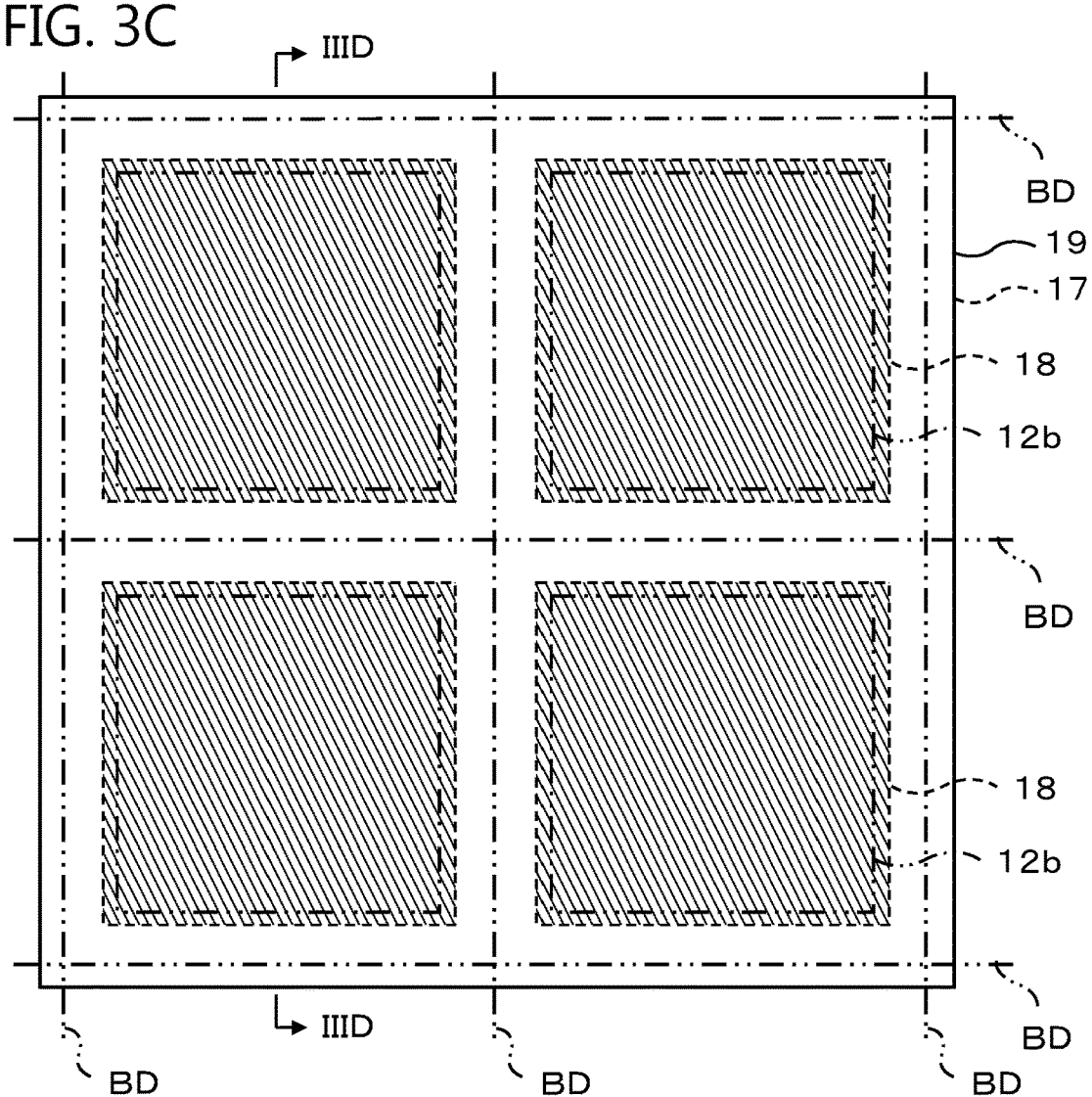
FIG. 3C is a plan view illustrating forming a metal layer in the method for manufacturing a light emitting element according to the first embodiment.
Figure 3D:
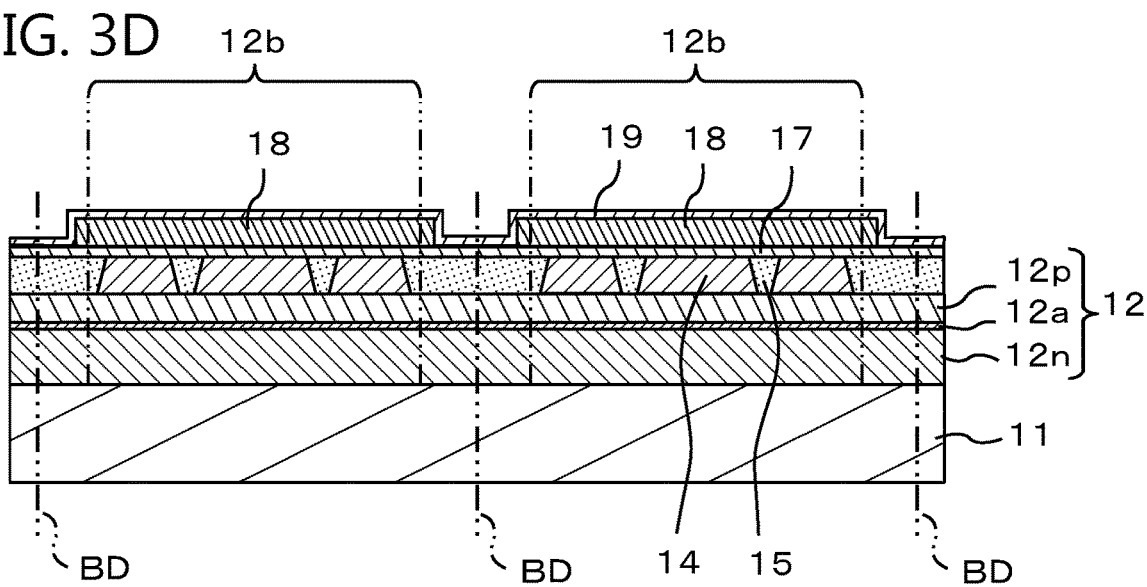
FIG. 3D is a cross-sectional view taken along line IIID-IIID in FIG. 3C illustrating forming the metal layer in the method for manufacturing a light emitting element according to the first embodiment.
Figure 3E:
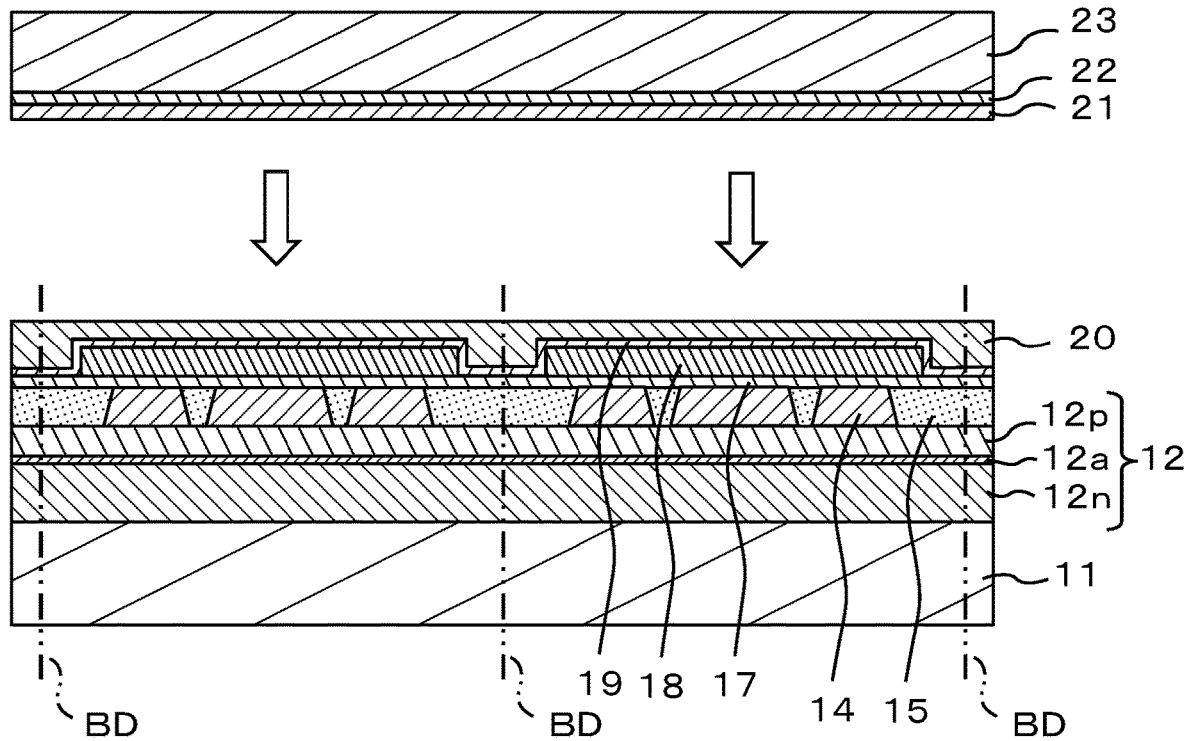
FIG. 3E is a cross-sectional view illustrating disposing a bonding member in the method for manufacturing a light emitting element according to the first embodiment.
Figure 3F:
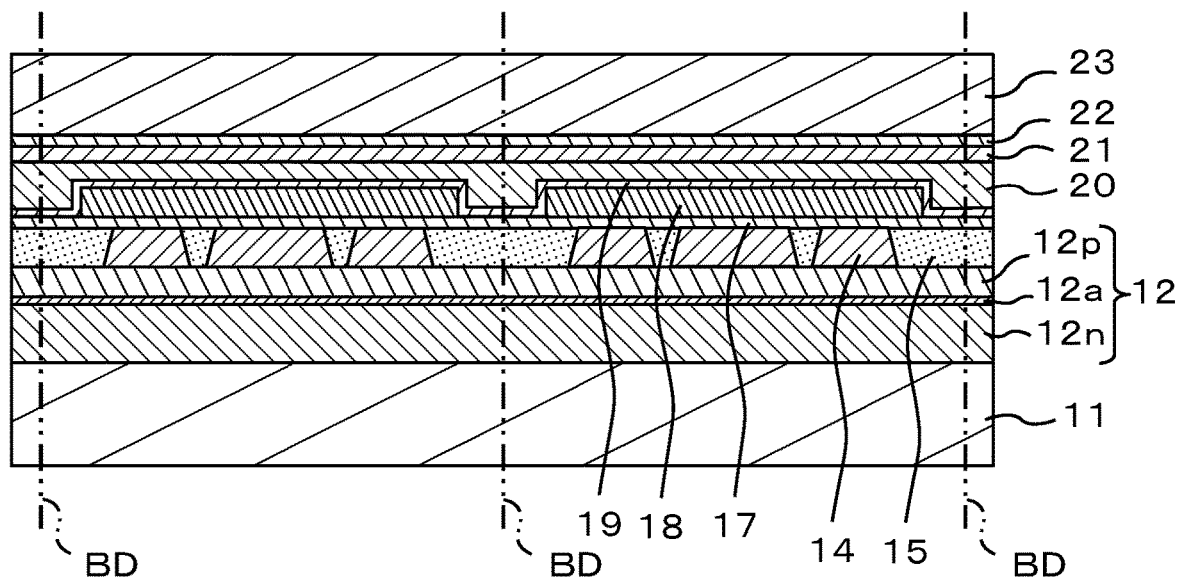
FIG. 3F is a cross-sectional view illustrating bonding a second substrate in the method for manufacturing a light emitting element according to the first embodiment.
Figure 3G:
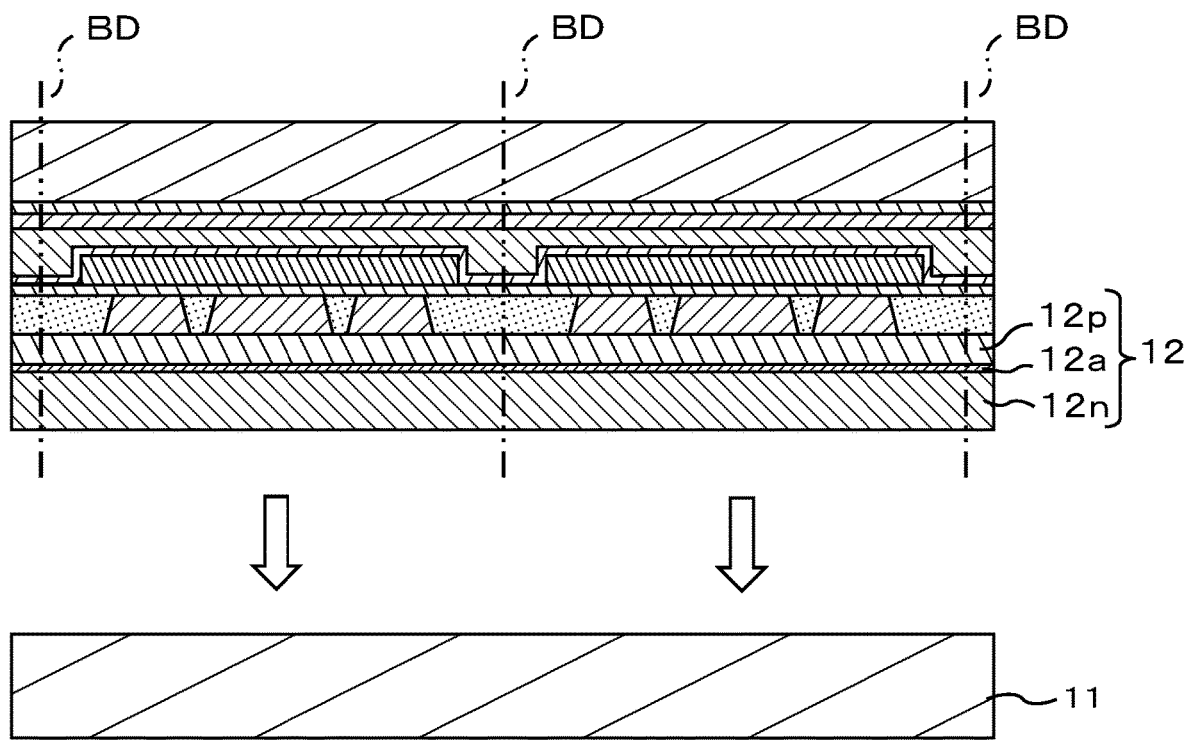
FIG. 3G is a cross-sectional view illustrating removing a first substrate in the method for manufacturing a light emitting element according to the first embodiment.
Figure 3H:
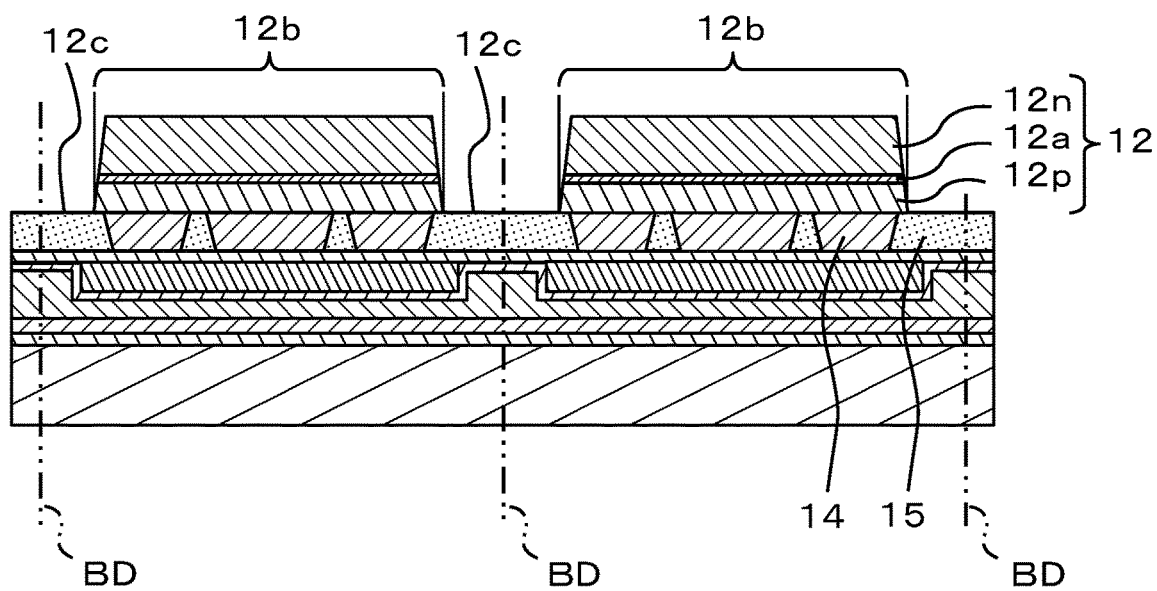
FIG. 3H is a cross-sectional view illustrating separating the semiconductor structure in the method for manufacturing a light emitting element according to the first embodiment.
Figure 3I:
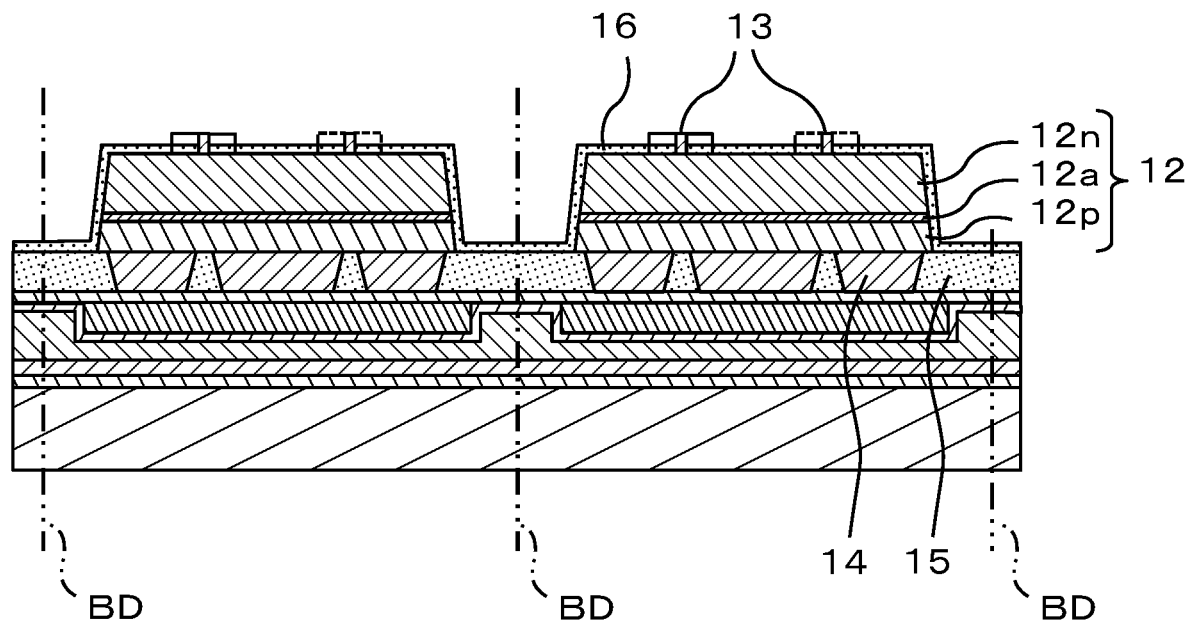
FIG. 3I is a cross-sectional view illustrating forming an upper electrode and protection film in the method for manufacturing a light emitting element according to the first embodiment.
Figure 3J:
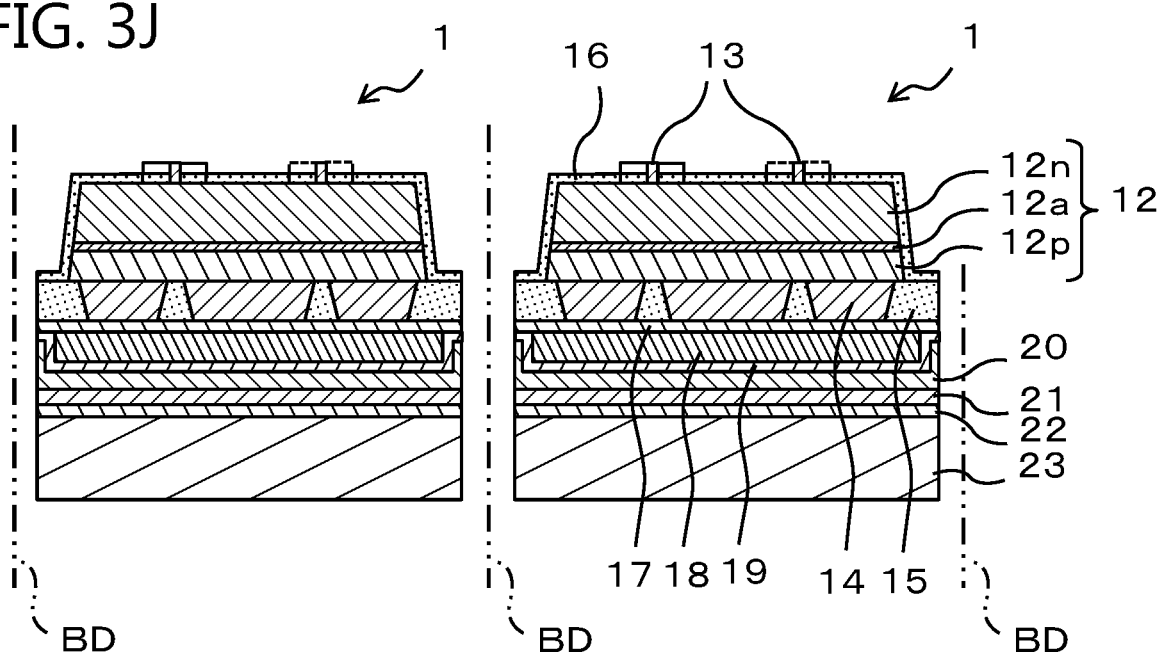
FIG. 3J is a cross-sectional view illustrating singulating in the method for manufacturing a light emitting element according to the first embodiment.

Next, a description is given of a method for manufacturing a light emitting element according to the present embodiment with reference to FIGS. 2 to 3J.

In FIGS. 3A to 3J, singulation lines BD represents virtual lines along which singulation of light emitting elements is to be performed. In other words, the singulation lines BD define individual light emitting element areas.

As shown in FIG. 2, the method for manufacturing the light emitting element according to the present embodiment includes a step S10 of forming a semiconductor structure, a step S11 of forming a lower electrode, a step S12 of providing a second substrate, a step S13 of forming a metal layer, a step S14 of disposing bonding members, a step S15 of bonding a second substrate, a step S16 of removing a first substrate, a step S17 of separating the semiconductor structure, a step S18 of forming an upper electrode and a protection film, and a step S19 of singulating.

In the step S10 of forming the semiconductor structure, a semiconductor structure 12 is formed on a first substrate 11, by forming thereon, in order: an n-side semiconductor layer 12n, an active layer 12a, and a p-side semiconductor layer 12p, as shown in FIG. 3A. The first substrate 11 is a growth substrate on which the semiconductor structure 12 is epitaxially grown by metal-organic chemical vapor deposition (MOCVD) or the like. A sapphire substrate or a silicon substrate may be used for the first substrate 11 when nitride semiconductors are used for the semiconductor structure 12.

In the step S11 of forming the lower electrode, a lower electrode 14 is formed on an upper surface of the semiconductor structure 12, i.e., an upper surface of the p-side semiconductor layer 12p, in each of the light emitting element areas, as shown in FIG. 3B. In this step, insulating films 15 are also formed on the upper surface of the p-side semiconductor layer 12p in the areas where the lower electrode 14 is not formed. The lower electrode 14 and the insulating films 15 can be formed by sputtering or the like.

Either of the lower electrode 14 and the insulating films 15 may be formed earlier.

The lower electrode 14 may be made of a metal such as Rh, Ag, Ni, Au, Ti, Al, Pt, or an alloy of these metals. The lower electrode 14 may be single-layered or multi-layered. Preferably, the layer in contact with the p-side semiconductor layer 12p is made of a material that provides an ohmic contact and good adhesion and has good light-reflecting properties.

The insulating films 15 may each be an oxide film made of an oxide such as $SiO_2$, $Nb_2O_5$, $Al_2O_3$, $ZrO_2$, or $TiO_2$, or may each be a nitride film made of a nitride such as AlN or SiN.

The step S12 of providing the second substrate prepares a second substrate 23 (see FIG. 3E), which is, in the step S15 of bonding the second substrate executed later, bonded above a side of the semiconductor structure 12 opposite the side thereof on which the first substrate 11 is located.

The second substrate 23 may be a metallic or ceramic substrate composed of a material such as Si, Mo, CuW, AlN, or glass. If the second substrate 23 is composed of a conductive material, the second substrate 23 is able to serve as a terminal for connecting with the outside.

The second substrate 23 may have a thickness of about 50 μm to 500 μm to have sufficient stiffness as a support substrate for supporting the semiconductor structure 12.

In the step S13 of forming the metal layer, a second metal layer 18 is formed above at least one of the side of the semiconductor structure 12 opposite the first substrate 11 and a side of the second substrate 23 which is to be arranged closer to the semiconductor structure 12 when the second substrate 23 is bonded above the side of the semiconductor structure 12 opposite the first substrate 11 later. In the present embodiment, the second metal layer 18 is formed above the side of the semiconductor structure 12 opposite the first substrate 11 as shown in FIGS. 3C and 3D. Specifically, the second metal layer 18 is formed on upper surfaces of the lower electrode 14 and the insulating films 15 via a first metal layer 17 serving as an adhesion layer. In addition, in this step, a third metal layer 19 is formed on an upper surface side of the second metal layer 18.

The first metal layer 17, the second metal layer 18, and the third metal layer 19 may be formed by sputtering or the like.

Note that, in FIG. 3C, the area where the second metal layer 18 is formed is hatched for clarity.

In each of the light emitting element areas, the semiconductor structure 12 includes a semiconductor portion 12b, which corresponds to the area where the semiconductor structure 12 is left after separating the semiconductor structure 12 per light emitting element area. Preferably, in each of the light emitting element areas, the second metal layer 18 is formed such that the area where the second metal layer 18 is present includes the area of the corresponding semiconductor portion 12b in a plan view, and that the second metal layer 18 is not disposed on any of singulation lines BD in a plan view. Because the second metal layer 18 is not disposed on the singulation lines BD, a gap may be formed in the second metal layer 18 between adjacent light emitting element areas. There may be a case in which this gap is not eliminated even after the third metal layer 19 and the bonding member 20 are formed. If the second metal layer 18 is formed in an area narrower than the semiconductor portion 12b, which has been separated from the semiconductor structure 12 in the later-described semiconductor structure separation step S17, a void due to this gap can be generated in between bonding surfaces. Due to the void, the later-described second substrate bonding step S15 may not be able to achieve good adhesion between the semiconductor portion 12b and the second substrate 23. It is thus possible to increase the adhesion between the semiconductor portion 12b and the second substrate 23 by arranging the second metal layer 18 such that the area where the second metal layer 18 is present includes the area where the semiconductor portion 12b is present in a plan view.

The second metal layer 18 is arranged on a side of the bonding members 20, 21 closer to the semiconductor structure 12. However, the second metal layer 18 needs only be arranged between the semiconductor structure 12 and the second substrate 23. Thus, the second metal layer 18 may be arranged on a side of the bonding members 20, 21 closer to the second substrate 23. Arranging the second metal layer 18 on the side of the bonding members 20, 21 closer to the semiconductor structure 12 enables forming the second metal layer 18 at a position relative to the singulation lines BD and the semiconductor portion 12b with higher positional accuracy than arranging the second metal layer 18 on the side of the bonding members 20, 21 closer to the second substrate 23 side. In addition, arranging the second metal layer 18 on the side of the bonding members 20, 21 closer to the semiconductor structure 12 enables a decrease in the inner stress generated when bonding the second substrate 23 above the semiconductor structure 12, resulting in good bonding adhesion therebetween.

When the semiconductor structure 12 and the second substrate 23 are bonded together by thermal compression bonding using the bonding members 20, 21, the resulted bonded body may warp afterward due to the difference between the thermal expansion coefficients of the semiconductor structure 12 and the bonding members 20, 21. The second metal layer 18 is provided to reduce this warp. The material used for the bonding members 20, 21 has a greater thermal expansion coefficient than those of the semiconductor materials generally used for the semiconductor structure 12. In view of this, in order to reduce the inner stress that is generated in the light emitting element 1 by the bonding members 20, 21 having been heated and then cooled to shrink, a material having a smaller thermal expansion coefficient than those of the bonding members 20, 21 is used for the second metal layer 18.

Preferably the second metal layer 18 is made of, for example, W, TiW, Mo, or Ta, or is a laminate including layers of the foregoing metals. In particular, it is preferable that the second metal layer 18 contain W as a major component. The second metal layer 18 may have a film thickness of about 200 nm to about 1000 nm.

For the materials of the first metal layer 17 and the third metal layer 19, materials having good adhesion with the lower electrode 14, insulating films 15, bonding member 20, and second metal layer 18 may be used. Examples of such materials include Ti. The first metal layer 17 and the third metal layer 19 may each have a film thickness of about 10 nm to about 1000 nm.

It is to be noted that either or both of the first metal layer 17 and the third metal layer 19 may be omitted.

The above-described materials for the second metal layer 18 each have relatively high hardness and a high melting point. Thus, in the later-described step S19 of singulating, it is difficult to cut the second metal layer 18 made either of the above materials in an efficient manner by a dicing method such as blade dicing or laser dicing. In the present embodiment, however, the second metal layer 18 is not disposed at the periphery of the light emitting element 1. Accordingly, it is not necessary to cut the second metal layer 18 when singulating the light emitting elements 1, which facilitates the singulation.

As shown in FIG. 3E, in the step S14 of disposing the bonding members, the bonding members 20 and 21 are formed respectively on the third metal layer 19, which is the bonding surface of the semiconductor structure 12, and the bonding surface of the second substrate 23. Although only one of the bonding members 20 and 21 may be formed, it is preferable to form both of them to obtain good bonding properties.

In the present embodiment, the bonding member 21 is arranged on the bonding surface of the second substrate 23 via a fourth metal layer 22 serving as an adhesion layer.

The bonding members 20, 21 and the fourth metal layer 22 can be formed by sputtering or the like.

The bonding member 20 may be formed in the step S13 of forming the metal layer, subsequently to the forming of the third metal layer 19. In addition, the bonding member 21 may be formed in the step S12 of providing the second substrate, subsequently to the forming of the fourth metal layer 22.

Preferably, the bonding members 20, 21 are made of a metallic material with a relatively low melting point, such as NiSn, AuSn, PbSn, Au, AuGe, or AuZn. Alternatively, the bonding members 20, 21 may each be an anisotropic conductive adhesive made of a thermosetting resin containing conductive particles.

The fourth metal layer 22 is disposed between the second substrate 23 and the bonding member 21 to increase the adhesion therebetween. The fourth metal layer 22 may be formed using the same material as that of the first metal layer 17 and the third metal layer 19 described above, with a thickness similar to those thereof. It is to be noted that the fourth metal layer 22 may be omitted.

In the step S15 of bonding the second substrate, the second substrate 23 is bonded above the semiconductor structure 12 via the bonding members 20, 21, as shown in FIG. 3F. To bond the bonding members 20 and 21 to each other, a heating step may be conducted, for example. The heating temperature in the bonding is determined according to the materials of the bonding members 20, 21. That is, when the bonding members 20, 21 are made of metal, the heating temperature is set to the melting point of the metal; and when the bonding members 20, 21 are each an anisotropic conductive adhesive, the heating temperature is set to the curing temperature of the thermosetting resin.

In the step S16 of removing the first substrate, the first substrate 11 is removed from the semiconductor structure 12, as shown in FIG. 3G. Specifically, the first substrate 11 may be peeled off from the semiconductor structure 12 by a laser lift-off method, etching, or the like.

In the step S17 of separating the semiconductor structure, the semiconductor structure 12 is separated into a plurality of semiconductor portions 12b such that the plurality of semiconductor portions 12b respectively correspond to light emitting element areas delimited by the singulation lines BD, as shown in FIG. 3H. Note that FIGS. 3H to 3J shows the order of the layers in the semiconductor structure 12 upside down with respect to FIGS. 3A to 3G for convenience.

In other words, in FIGS. 3H to 3J, the semiconductor structure 12 is shown such that the uppermost layer of the semiconductor structure 12 is the n-side semiconductor layer 12n.

In the step S17 of separating the semiconductor structure, grooves 12c penetrating the semiconductor structure 12 in the thickness direction thereof are formed in areas corresponding to the singulation lines BD of the semiconductor structure 12, so that semiconductor portions 12b respectively corresponding to the plurality of light emitting element areas are left in predetermined areas.

The grooves 12c may be formed by etching the semiconductor structure 12 using a resist mask.

Optionally, before or after separating the semiconductor structure 12, the upper surface of the semiconductor structure 12 may be roughened by etching to form unevenness.

In the step S18 of forming the upper electrode and the protection film, upper electrodes 13 are formed on the upper surface of the semiconductor structure 12 and a protection film 16 covering the upper surface of the semiconductor structure 12 is formed, as shown in FIG. 3I.

The upper electrodes 13 and the protection film 16 may be formed for example by sputtering. Either the upper electrodes 13 or the protection film 16 may be formed earlier.

The material and structure for each of the upper electrodes 13 may be the same as those of the lower electrode 14 described above. Preferably, in order to function as a pad electrode, the uppermost layer of each of the upper electrodes 13 is made of Au, Al, or a metal from the platinum group, which are suitable for wire bonding or the like.

The protection film 16 may be made of a material having good light transmissive properties. Specifically, the materials for the insulating films 15 described above can be used for the protection film 16.

In the step S19 of singulating, singulation of a plurality of light emitting elements 1 is carried out as shown in FIG. 3J. Specifically, the bonded body in which the semiconductor structure 12 and the second substrate 23 are bonded together is divided along the singulation lines BD, which are virtual lines defining a plurality of light emitting element areas, to singulate the bonded body into the plurality of light emitting elements 1. The division along the singulation lines BD may be carried out by a dicing method such as blade dicing or laser dicing. When the division is carried out, in the bonded body, the protection film 16, the insulating films 15, the first metal layer 17, the third metal layer 19, the bonding members 20 and 21, the fourth metal layer 22, and the second substrate 23 are cut. Because the second metal layer 18 is not disposed on the singulation lines BD in a plan view, singulation is readily performed.

The above-performed steps are able to manufacture the light emitting elements 1.

Second Embodiment

[Configuration of Light Emitting Element]

Figure 4:
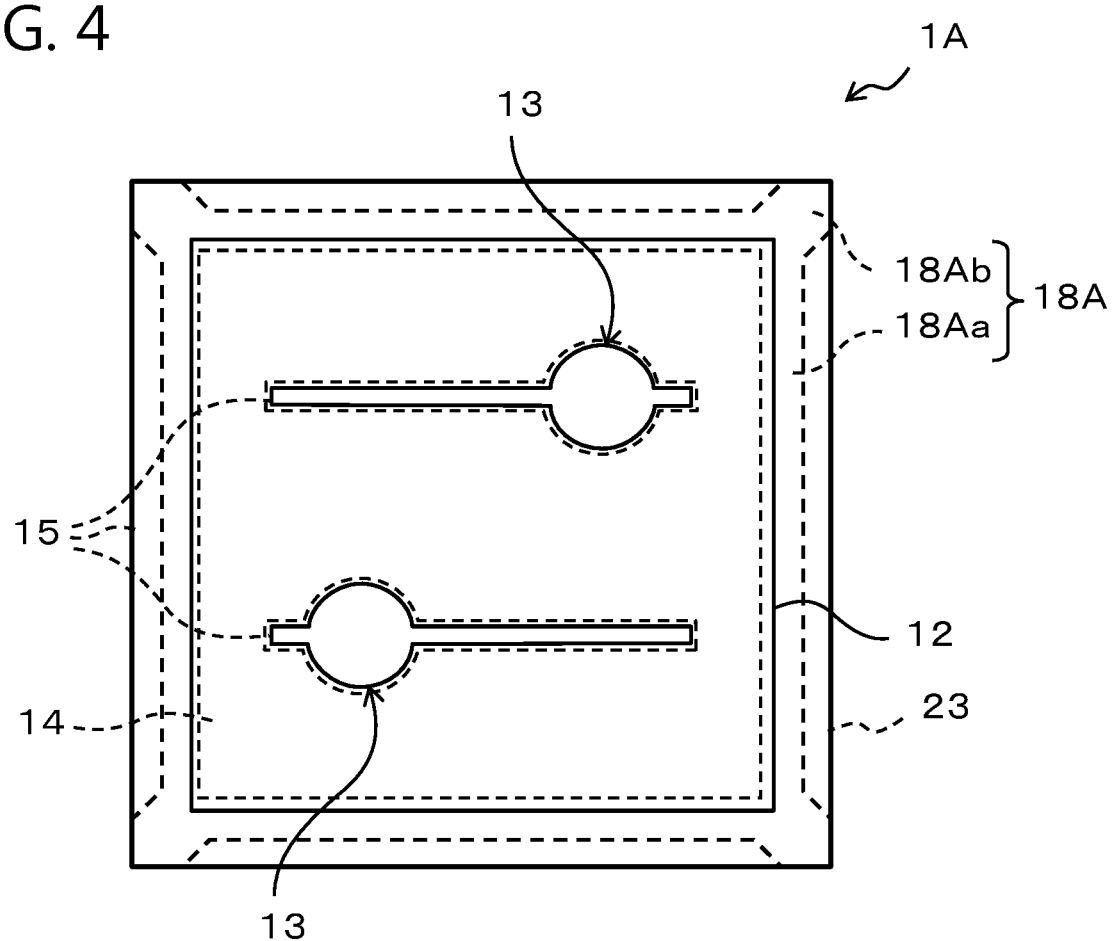
FIG. 4 is a plan view showing a configuration of a light emitting element that is obtained by a method for manufacturing a light emitting element according to a second embodiment.

Next, with reference to FIG. 4, a description is given of the configuration of a light emitting element 1A that is manufactured by a method for manufacturing a light emitting element according to a second embodiment.

The light emitting element 1A is as same as the light emitting element 1 of the first embodiment except that the light emitting element 1A has a second metal layer 18A in place of the second metal layer 18.

Note that the other aspects of the configuration of the light emitting element 1A are as the same as those of the light emitting element 1, and thus descriptions thereof are omitted.

As shown in FIG. 4, the second metal layer 18A in the light emitting element 1A is disposed such that the area where the second metal layer 18A is present includes the area of the corresponding semiconductor structure 12 in a plan view. The second metal layer 18A is composed of a main portion 18Aa formed in an area spaced inwardly from the outer edge of the light emitting element 1 in a plan view and extended portions 18Ab that each extend from the main portion 18Aa to the outer edge of the light emitting element 1A. More specifically, the main portion 18Aa has a square shape in a plan view and is disposed so as to occupy the same area as the second metal layer 18 in the light emitting element 1 according to the first embodiment, and the extended portions 18ab respectively extend from four corners of the square shape to the outer edge of the light emitting element 1A.

Although details are described later, when a plurality of light emitting elements 1A are arranged in an array format in a manufacturing process, the second metal layer 18A is formed such that the main portion 18Aa in one light emitting element 1A is connected through extended portions 18Ab to main portions 18Aa located in adjacent or diagonally adjacent light emitting elements 1A. Because main portions 18Aa of the second metal layer 18A are formed connected with one another in the manufacturing process, the adhesion between the second metal layer 18A and a surface on which the second metal layer 18A is formed is increased, which reduces the tendency of the second metal layer 18A to peel off from the surface.

Note that the second metal layer 18A may be arranged on the side of the second substrate 23.

[Method for Manufacturing Light Emitting Element]

Figure 5:
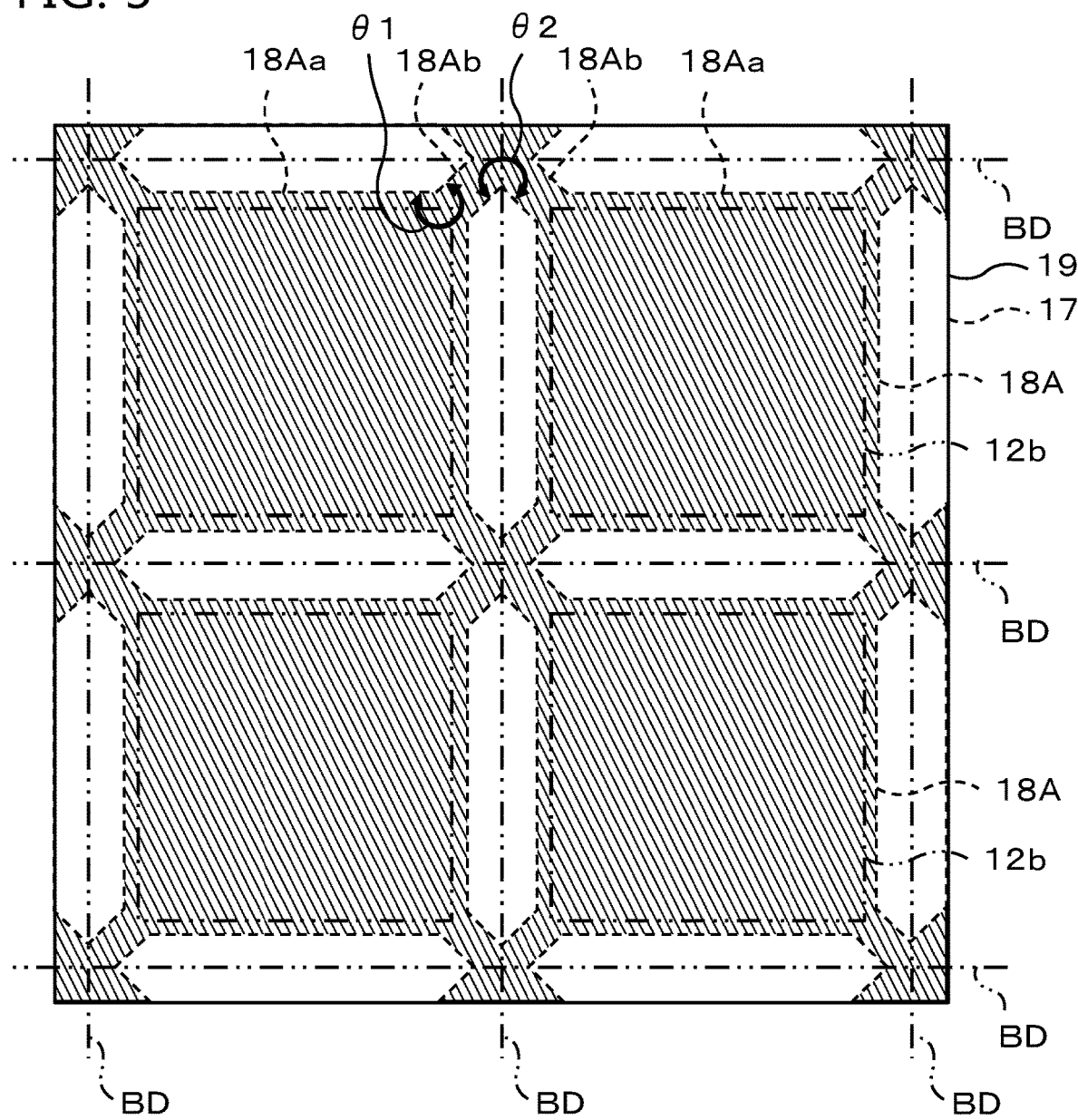
FIG. 5 is a plan view illustrating forming a metal layer in the method for manufacturing a light emitting element according to the second embodiment.

Next, a description is given of a method for manufacturing a light emitting element according to the second embodiment with reference to FIG. 5.

In the method for manufacturing a light emitting element according to the second embodiment, the area where the second metal layer 18A is formed in the metal layer forming step S13 differs from that of the first embodiment. The other manufacturing steps are the same as those of the first embodiment, and thus their detailed description is omitted.

In the step S13 of forming the metal layer of the second embodiment, as shown in FIG. 5, the second metal layer 18A formed in one light emitting element area is partially connected with the second metal layer 18A formed in adjacent or diagonally adjacent light emitting element areas. Specifically, in one light emitting element area, the second metal layer 18A is formed to have one main portion 18Aa, which corresponds to the second metal layer 18 located in one light emitting element area in the first embodiment, such that the one main portion 18Aa has corners from each of which one extended portion 18Ab extends and connects with other extended portions 18Ab in other light emitting element areas adjacent or diagonally adjacent to the one light emitting element area.

Note that, in FIG. 5, the area where the second metal layer 18 is formed is hatched for clarity.

Connecting the main portions 18Aa of the second metal layer 18A partially with one another reduces the tendency of the second metal layer 18A to peel off from the surface on which the second metal layer 18A is formed. In general, a metal layer of a shape having a corner in a plan view, such as the rectangular shape of the second metal layer 18 in the first embodiment or another polygonal shape, tends to peel off from the corner. In particular, that tendency is increased when the angle of the corner is small. Each of the main portions 18Aa of the second metal layer 18A in the second embodiment has corners from each of which an extended portion 18Ab extends. For this reason, as shown in FIG. 5, in a state in which main portions 18Aa in the second metal layer 18A are connected with one another through extended portions 18Ab, there is no corner having an angle of less than 180°, unlike the first embodiment in which the second metal layer 18 has corners each having a right angle. Each of the main portions 18Aa and an extended portion 18Ab extending from the main portion 18Aa define a corner therebetween having an angle $\theta 1$; and the extended portion 18Ab and another extended portion 18Ab connected thereto define a corner therebetween having an angle $\theta 2$. Because both the angles $\theta 1$ and $\theta 2$ are greater than 180°, those corners are not likely to peel off.

By reducing the possibility of the second metal layer 18A peeling off, it is possible to improve the reliability and production yield of the light emitting element 1A.

Although, in the second metal layer 18A, connecting portions that each interconnect adjacent and diagonally adjacent extended portions 18Ab are disposed on singulation lines BD in a plan view, the main portions 18Aa and the extended portions 18Ab excluding the connecting portions are not disposed on any singulation line BD in a plan view. For this reason, when division is performed along the singulation lines BD in the step S19 of singulating, the length of the paths along which the second metal layer 18A is divided is short, and thus the singulation is easily performed. As a result, light emitting elements 1A are manufactured with good productivity.

Preferably, the extended portions 18Ab each have a narrow width on the singulation lines BD in view of the influence on the singulation operation. However, in order to reconcile the ease of singulation and the suppression of peeling off, it is preferable that the width of an extended portion 18Ab is, with respect to the length of a side of a light emitting element 1A, about 0.1% to about 50%, or more preferably about 0.5% to about 20%.

Third Embodiment

[Configuration of Light Emitting Element]

Figure 6A:
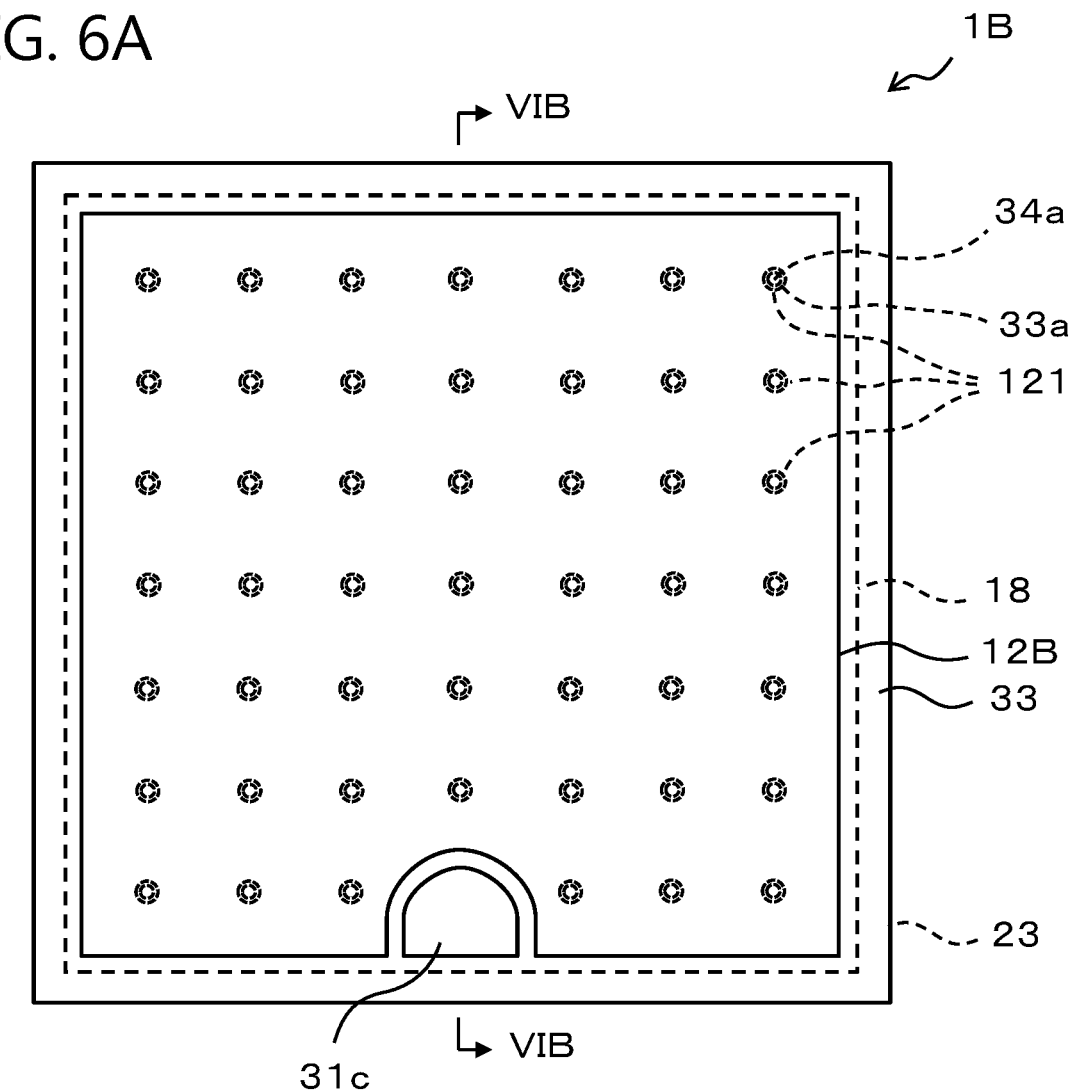
FIG. 6A is a plan view showing a configuration of a light emitting element that is obtained by a method for manufacturing a light emitting element according to a third embodiment.
Figure 6B:
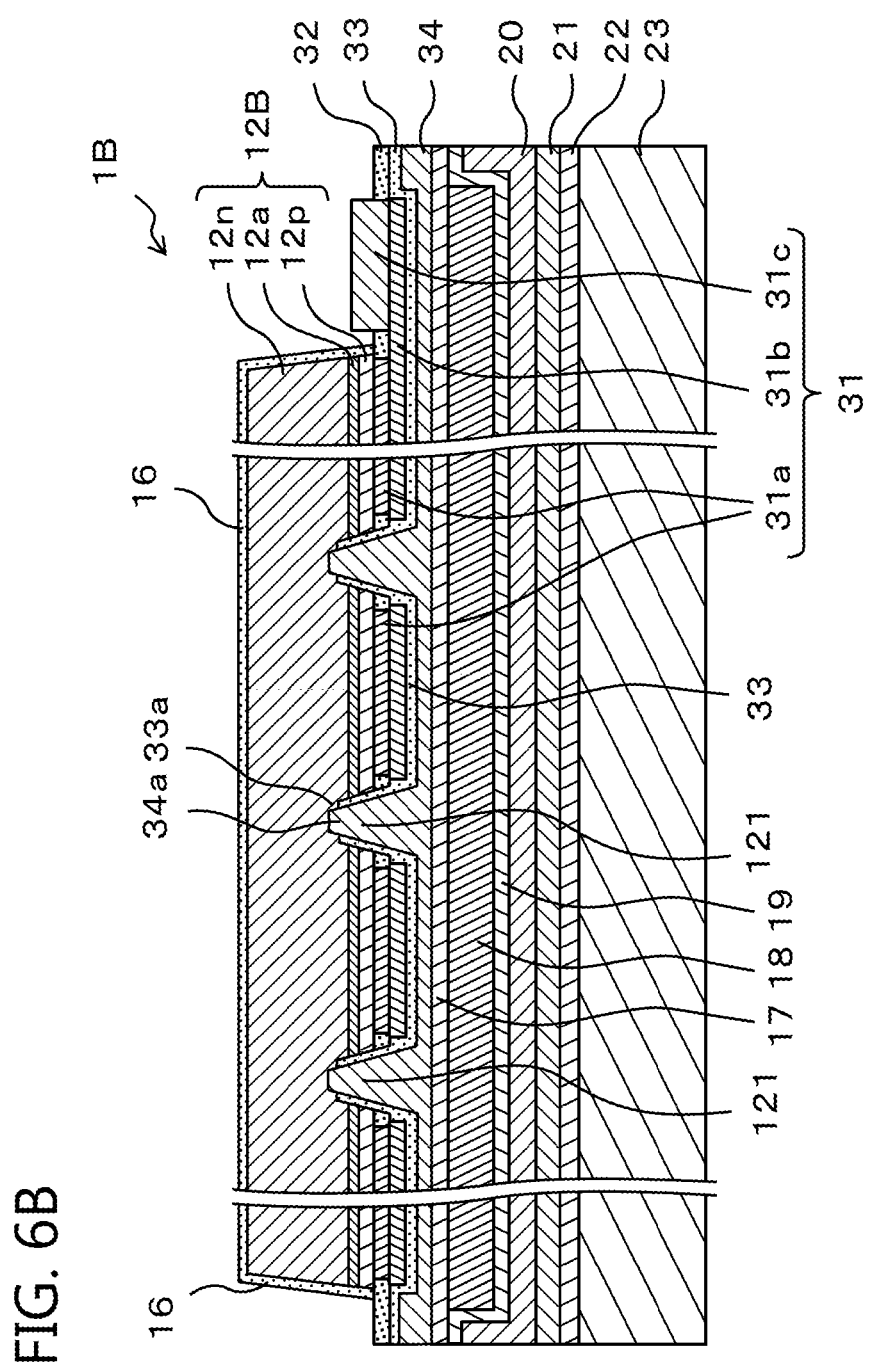
FIG. 6B is a cross-sectional view taken along line VIB-VIB in FIG. 6A showing the configuration of the light emitting element that is obtained by the method for manufacturing a light emitting element according to the third embodiment.

Next, a description is given of a light emitting element 1B that is manufactured by a method for manufacturing a light emitting element according to a third embodiment, with reference to FIGS. 6A and 6B.

Note that FIG. 6B is a cross-sectional view taken along line VIB-VIB in FIG. 6A, omitting illustration of three of six holes 121 arranged on line VIB-VIB, for convenience of illustration.

A light emitting element 1 in the first embodiment is configured to have an upper surface side on which upper electrodes 13 connected to an n-side semiconductor layer 12n is disposed, and have a lower surface side on which a lower electrode 14 connected to a p-side semiconductor layer 12p is disposed. In contrast, a light emitting element 1B in the third embodiment has an upper surface side on which an upper electrode 31 connected to a p-side semiconductor layer 12p is disposed, and has a lower surface side on which a lower electrode 34 connected to an n-side semiconductor layer 12n is disposed. Namely, a light emitting element of the present disclosure may be configured so as to change the correspondence of the electrodes disposed on upper and lower surface sides of the light emitting element to the respective conductive types of semiconductor layers.

As shown in FIGS. 6A and 6B, in contrast to the light emitting element 1 according to the first embodiment, the light emitting element 1B according to the third embodiment specifically has an upper electrode 31 in place of the upper electrodes 13, a lower electrode 34 in place of the lower electrode 14, and a semiconductor structure 12B in place of the semiconductor structure 12, and further has a first insulating film 32 and a second insulating film 33.

Note that the first metal layer 17 to the second substrate 23, which are arranged on the lower layer side of the lower electrode 34, are the same as the first embodiment, and thus their detailed description is omitted. Note that the second metal layer 18A of the second embodiment may be used in place of the second metal layer 18. Preferably, like the first embodiment, the second metal layer 18 is disposed such that the area where the second metal layer 18 is disposed includes the area where the semiconductor structure 12B is disposed in a plan view and does not overlap with at least part of the singulation lines BD in a plan view.

The semiconductor structure 12B has an approximately square shape in a plan view, but partially has an area in which no semiconductor layer is formed and instead an external connection portion 31c of the upper electrode 31 is disposed. The semiconductor structure 12B has holes 121 each of which penetrates the p-side semiconductor layer 12p and the active layer 12a from the lower side of the semiconductor structure 12B and has a bottom at the n-side semiconductor layer 12n. The holes 121 are arranged approximately evenly throughout the area where the semiconductor structure 12B is disposed in a plan view.

The holes 121 are provided to electrically connect the lower electrode 34 and the n-side semiconductor layer 12n. The lower electrode 34 has protrusions 34a each of which extends through corresponding one of the holes 121 and is in contact with the n-side semiconductor layer 12n to make an electrical connection. A second insulating film 33 is disposed on the upper surface of the lower electrode 34 and the side surfaces of the protrusions 34a so that the lower electrode 34 is insulated from a wiring portion 31b of the upper electrode 31, the p-side semiconductor layer 12p, and the active layer 12a. The second insulating film 33 has openings 33a, from each of which an end portion of corresponding one of the protrusions 34a of the lower electrode 34 protrudes.

The upper electrode 31 is composed of: an inner connection portion 31a disposed on a lower surface of the p-side semiconductor layer 12p approximately throughout the entire area thereof; the wiring portion 31b disposed on a lower surface side of the inner connection portion 31a; and the external connection portion 31c disposed on a part of an upper surface of the wiring portion 31b. The inner connection portion 31a is a whole-surface electrode for distributing a current supplied from the outside to the p-side semiconductor layer 12p and serves as a reflective film that upwardly reflects light propagating in the semiconductor structure 12B. Preferably, the inner connection portion 31a is made of a metal having good light-reflecting properties, such as Ag. The external connection portion 31c is a pad electrode for connecting with an external power supply. The wiring portion 31b is an electrode for connecting the inner connection portion 31a and the external connection portion 31c.

In the same layer as the inner connection portion 31a, the first insulating film 32 is disposed in a complementary manner with the inner connection portion 31a.

Side surfaces and an upper surface of the semiconductor structure 12B are covered by a protection film 16. However, the upper surface of the semiconductor structure 12B may be partially exposed. In addition, the upper surface of the semiconductor structure 12B may be configured to have unevenness.

The materials for the upper electrode 31 and the lower electrode 34 may be the same as those for the upper electrodes 13 and the lower electrode 14 in the first embodiment. The materials for the first insulating film 32 and the second insulating film 33 may be the same as those for the insulating films 15 in the first embodiment.

For a light emitting element 1B in the third embodiment, a structure that functions as an LED arranged above the first metal layer 17 and a manufacturing method of the structure are detailed in Japanese Patent Publication No. 2014-86573, and thus further description of the structure and manufacturing method thereof is omitted.

[Method for Manufacturing Light Emitting Element]

The light emitting element 1B according to the third embodiment can be manufactured in the same manner as the first embodiment by: forming the first metal layer 17, the second metal layer 18, the third metal layer 19, and bonding members 20, 21 and the like; and bonding them and the second substrate 23 together. Thus detailed description of the manufacturing method is omitted.

Above, a description has been given of certain embodiments of the present invention. However, the scope of the present invention is not limited to the above description, and is rather to be broadly interpreted based on the recitations in claims. In addition, it goes without saying that various modifications and variations made based on the above description are also included in the scope of the present invention.

The methods for manufacturing a light emitting element according to the embodiments of the present invention are applicable to light emitting elements such as LEDs.

What is claimed is:

1. A method for manufacturing a plurality of light emitting elements, the method comprising:
   forming a semiconductor structure on a first substrate, wherein the semiconductor structure includes a plurality of light emitting element areas defined by virtual singulation lines, each of the light emitting element areas encompassing an area that will be divided into a respective one of the light emitting elements;
   forming a first electrode on a first portion of the semiconductor structure, and forming an insulating film on a second portion of the semiconductor structure;
   forming a metal layer above the first electrode and the insulating film, such that the metal layer extends over an upper surface of the first electrode and over an upper surface of the insulating film;
   forming a bonding member above the metal layer and the insulating film, wherein a thickness of the bonding member at the virtual singulation lines is greater than a thickness of the bonding member at the plurality of light emitting element areas;
   bonding a second substrate to the metal layer via the bonding member;
   removing the first substrate from the semiconductor structure to obtain a bonded body in which the second substrate is bonded above the semiconductor structure; and
   singulating the bonded body into the plurality of light emitting elements by dividing the bonded body along the virtual singulation lines defining a plurality of light emitting element areas,
   wherein a thermal expansion coefficient of the metal layer is smaller than a thermal expansion coefficient of the bonding member, and the metal layer is formed such that, in a plan view, the metal layer does not overlap with at least a part of the virtual singulation lines and is present in each of the plurality of light emitting element areas.

2. The method according to claim 1, further comprising, between the step of removing the first substrate and the step of singulating the bonded body, separating the semiconductor structure into a plurality of semiconductor portions respectively corresponding to the plurality of light emitting element areas by forming grooves that penetrate the semiconductor structure in a thickness direction of the semiconductor structure along the virtual singulation lines.

3. The method according to claim 2, wherein, in the step of forming the metal layer, the metal layer is formed such that, in a plan view, areas where the metal layer is present include areas where the plurality of semiconductor portions are present.

4. The method according to claim 1, wherein:
   the plurality of light emitting element areas includes a first light emitting element area that will be divided into a first of the light emitting elements, and a second light emitting element area that will be divided into a second of the light emitting elements, wherein the first light emitting element area is laterally or diagonally adjacent to the second light emitting element area, and
   in the step of forming the metal layer, the metal layer is formed to comprise:
   a first main portion located in the first light emitting element area, and a second main portion located in the second light emitting element area, and
   an extending portion that connects the first main portion to the second main portion.

5. The method according to claim 2, wherein:
   the plurality of light emitting element areas includes a first light emitting element area that will be divided into a first of the light emitting elements, and a second light emitting element area that will be divided into a second of the light emitting elements, wherein the first light emitting element area is laterally or diagonally adjacent to the second light emitting element area, and
   in the step of forming the metal layer, the metal layer is formed to comprise:
   a first main portion located in the first light emitting element area, and a second main portion located in the second light emitting element area, and
   an extending portion that connects the first main portion to the second main portion.

6. The method according to claim 3, wherein:
the plurality of light emitting element areas includes a first light emitting element area that will be divided into a first of the light emitting elements, and a second light emitting element area that will be divided into a second of the light emitting elements, wherein the first light emitting element area is laterally or diagonally adjacent to the second light emitting element area, and
in the step of forming the metal layer, the metal layer is formed to comprise:
a first main portion located in the first light emitting element area, and a second main portion located in the second light emitting element area, and
an extending portion that connects the first main portion to the second main portion.

7. The method according to claim 4, wherein:
each of the plurality of light emitting element areas has a polygonal shape, and
the extending portion connects the first main portion to the second main portion at corners of the first and second light emitting element areas.

8. The method according to claim 5, wherein:
each of the plurality of light emitting element areas has a polygonal shape, and
the extending portion connects the first main portion to the second main portion at corners of the first and second light emitting element areas.

9. The method according to claim 6, wherein:
each of the plurality of light emitting element areas has a polygonal shape, and
the extending portion connects the first main portion to the second main portion at corners of the first and second light emitting element areas.

10. The method according to claim 1, wherein the metal layer contains W.

11. The method according to claim 2, wherein the metal layer contains W.

12. The method according to claim 3, wherein the metal layer contains W.

13. The method according to claim 4, wherein the metal layer contains W.

14. The method according to claim 1, wherein, in the step of forming the metal layer, the metal layer is formed between adhesion layers that are made of a metal that is different from a metal of the metal layer.

15. The method according to claim 2, wherein, in the step of forming the metal layer, the metal layer is formed between adhesion layers that are made of a metal that is different from a metal of the metal layer.

16. The method according to claim 3, wherein, in the step of forming the metal layer, the metal layer is formed between adhesion layers that are made of a metal that is different from a metal of the metal layer.

17. The method according to claim 4, wherein, in the step of forming the metal layer, the metal layer is formed between adhesion layers that are made of a metal that is different from a metal of the metal layer.

18. A method for manufacturing a plurality of light emitting elements, the method comprising:
forming a semiconductor structure on a first substrate, wherein the semiconductor structure includes a plurality of light emitting element areas defined by virtual singulation lines, each of the light emitting element areas encompassing an area that will be divided into a respective one of the light emitting elements, wherein the plurality of light emitting element areas includes a first light emitting element area that will be divided into a first of the light emitting elements, and a second light emitting element area that will be divided into a second of the light emitting elements, wherein the first light emitting element area is laterally or diagonally adjacent to the second light emitting element area;
forming a metal layer above a side of the semiconductor structure opposite the first substrate, wherein the metal layer is formed to comprise:
a first main portion located in the first light emitting element area, and a second main portion located in the second light emitting element area, and
an extending portion that connects the first main portion to the second main portion;
forming a bonding member above the metal layer;
bonding a second substrate to the metal layer via the bonding member;
removing the first substrate from the semiconductor structure to obtain a bonded body in which the second substrate is bonded above the semiconductor structure; and
singulating the bonded body into a plurality of light emitting elements by dividing the bonded body along the virtual singulation lines defining a plurality of light emitting element areas,
wherein a thermal expansion coefficient of the metal layer is smaller than a thermal expansion coefficient of the bonding member, and the metal layer is formed such that, in a plan view, the metal layer does not overlap with at least a part of the virtual singulation lines and is present in each of the plurality of light emitting element areas.

19. The method according to claim 18, further comprising, between the step of removing the first substrate and the step of singulating the bonded body, separating the semiconductor structure into a plurality of semiconductor portions respectively corresponding to the plurality of light emitting element areas by forming grooves that penetrate the semiconductor structure in a thickness direction of the semiconductor structure along the virtual singulation lines.

20. The method according to claim 19, wherein, in the step of forming the metal layer, the metal layer is formed such that, in a plan view, areas where the metal layer is present include areas where the plurality of semiconductor portions are present.

21. The method according to claim 18, wherein:
each of the plurality of light emitting element areas has a polygonal shape, and
the extending portion connects the first main portion to the second main portion at corners of the first and second light emitting element areas.

22. The method according to claim 19, wherein:
each of the plurality of light emitting element areas has a polygonal shape, and
the extending portion connects the first main portion to the second main portion at corners of the first and second light emitting element areas.

23. The method according to claim 20, wherein:
each of the plurality of light emitting element areas has a polygonal shape, and
the extending portion connects the first main portion to the second main portion at corners of the first and second light emitting element areas.

24. The method according to claim 18, wherein the metal layer contains W.

25. The method according to claim 19, wherein the metal layer contains W.

26. The method according to claim 18, wherein, in the step of forming the metal layer, the metal layer is formed between adhesion layers that are made of a metal that is different from a metal of the metal layer.

27. The method according to claim 19, wherein, in the step of forming the metal layer, the metal layer is formed between adhesion layers that are made of a metal that is different from a metal of the metal layer.

28. The method according to claim 20, wherein, in the step of forming the metal layer, the metal layer is formed between adhesion layers that are made of a metal that is different from a metal of the metal layer.

29. The method according to claim 1, wherein a thickness of the first electrode is the same as a thickness of the insulating film.

30. The method according to claim 1, further comprising:
   forming a second electrode on a surface of the semiconductor structure that is opposite a surface of the semiconductor structure on which the first electrode is formed,
   wherein an area of the first electrode does not overlap with an area of the second electrode.

\* \* \* \* \*